United States Patent [19]

Hashimoto

[11] Patent Number: 4,963,196
[45] Date of Patent: Oct. 16, 1990

[54] ORGANIC SOLAR CELL

[75] Inventor: Yuichi Hashimoto, Tokyo, Japan

[73] Assignee: Canon Kabushiki Kaisha, Tokyo, Japan

[21] Appl. No.: 308,636

[22] Filed: Feb. 10, 1989

[30] Foreign Application Priority Data

Feb. 18, 1988 [JP] Japan .................................. 63-33997

[51] Int. Cl.$^5$ ............................................ H01L 31/06
[52] U.S. Cl. .............................. 136/257.000; 136/263
[58] Field of Search ................................. 136/257, 263

[56] References Cited

U.S. PATENT DOCUMENTS 3,057,947 10/1962 Calvin et al. ......................... 136/263

FOREIGN PATENT DOCUMENTS 52-17827 2/1977 Japan .................................. 136/263

Primary Examiner—Aaron Weisstuch
Attorney, Agent, or Firm—Fitzpatrick, Cella, Harper & Scinto

[57] ABSTRACT

An organic solar cell, comprising an organic photoconductive layer comprising a charge generating substance and a charge transporting substance, and a protective layer covering the organic photoconductive layer blocking low-wavelength light of below 450 nm. Because of the presence of the protective layer, a change in photo-current due to photo-degradation of the charge transporting substance is suppressed while maintaining a high photo-electric conversion efficiency.

5 Claims, 1 Drawing Sheet

ORGANIC SOLAR CELL

BACKGROUND OF THE INVENTION

Field of the Invention and Related Art

The present invention relates to an organic solar cell.

An organic solar cell may be composed by forming a p-n junction between silicon, etc. and an organic dye, or by joining a metal and an organic dye so as to convert light energy into electric energy. The organic dye may be a natural dye such as chlorophyll, synthetic dye or pigment such as merocyanine or phthalocyanine, an electroconductive polymer such as polyacetylene, or a composite material of these which may be formed into a film by vacuum evaporation or casting.

An organic solar cell has advantages such as a better economic factor and a lower production cost compared with a conventional solar cell obtained by forming a p-n junction on a single crystal such as silicon, germaium, etc. so that it attracted attention and has been developed in recent years as a solar cell for civil use.

When an organic photoconductive material is used as a solar cell, produced photo-carriers are transported due to a potential difference across a Schottky junction formed between the organic photoconductive layer and a metal electrode to produce photo-electromotive force. A layer comprising an organic photoconductive material, however, involves difficulties in carrier transport characteristics, such as frequent carrier trapping and a low carrier mobility. For this reason, it has been proposed to form a new device form wherein the organic photoconductive layer is functionally separated into a charge generating substance and a charge transporting substance so as to facilitate carrier movement.

However, most charge transporting substances used in such a function separation-type organic solar cell absorb low wavelength light, so that when they are irradiated with light such as sunlight for a long period of time, the charge transporting substances are liable to cause denaturation or degradation, resulting in an increase in carrier trapping or a decrease in mobility which retards carrier movement. Thus, there is involved a problem of lowering in conversion efficiency due to instability against a strong irradiating light.

SUMMARY OF THE INVENTION

The present invention has been accomplished in view of the above-problem, and an object thereof is to provide an organic solar cell having stability in continuous use by suppressing the photo-degradation of a charge transporting substance and also having a high photoelectric conversion efficiency. According to the present invention, there is provided an organic solar cell, comprising an organic photoconductive layer comprising a charge generating substance and a charge transporting substance, and a protective layer covering the organic photoconductive layer blocking low-wavelength light of below 450 nm. The degradation with time of a charge transporting substance due to low wavelength is suppressed by the protective layer thereby to ensure stability in continuous use. On the other hand, the greater part of visible light ranging from 400 nm to 750 nm is utilized for photoelectric conversion whereby a high photoelectric conversion efficiency may be maintained.

These and other object, features and advantages of the present invention will become more apparent upon a consideration of the following description of the preferred embodiments of the present invention taken in conjunction with the accompanying drawing.

DESCRIPTION OF THE PREFERRED EMBODIMENTS

Figure 1:
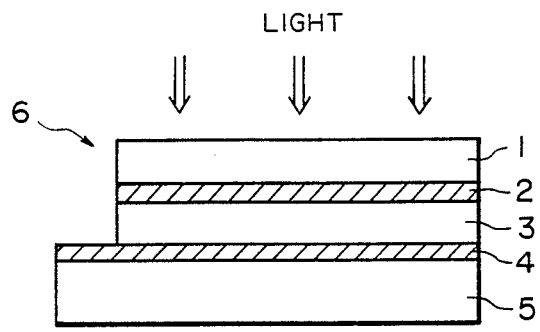
FIG. 1 is a longitudinal sectional view of an embodiment of the organic solar cell according to the present invention.

FIG. 1 is a longitudinal sectional view of an embodiment of the organic solar cell according to the present invention.

Referring to FIG. 1, the cell comprises an organic photoconductive dispersion film 3 sandwiched between an optically transparent electrode 2 on the upper side and a counter electrode 4 on the lower side. The counter electrode 4 is supported by a substrate 5. When the cell is irradiated with light from the upper side as shown in FIG. 1, produced photo-carriers are moved according to a potential difference across a Schottky junction formed between the organic photoconductive dispersion film 3 and the electrode 2 to generate photo-electromotive force.

In the organic solar cell 6 according to the present invention, the optically transparent electrode 2 is covered with a protective layer 1.

The protective layer 1 is required to block low-wavelength light of below 450 nm (1 nm=10$^{-9}$ m). This is because an ordinary charge transporting substance in the organic photoconductive dispersion film 3 has a photo-absorption edge below 450 nm, so that if low wavelength light of below 450 nm is blocked, it is possible to prevent the charge transporting substance from absorbing the low wavelength light.

In this instance it is preferred that the following relation is satisfied:

$$\lambda_0 \leq \lambda_1 \leq \lambda_0 + 50,$$

wherein, $\lambda_1$[nm], denotes the absorption edge of the protective layer 1, and $\lambda_0$ [nm] denotes the absorption edge of the charge transporting substance. This is because the difference between the absorption edge $\lambda_0$ of the charge transporting layer and the absorption edge $\lambda_1$ of the protective layer is reduced to avoid excessive light blocking by the protective layer 1 and thereby, maximize the quantity of visible light passing through the protective layer, whereby the photoelectric conversion efficiency is increased.

Further, it is preferred that the protective layer 1 have a transmittance of 60% or above, preferably 80% or above, with respect to visible light e.g., light having a flat intensity distribution in the wavelength range of 500 to 700 nm. This is desired so as not to impair the photoelectric conversion efficiency of the organic solar cell according to the present invention.

The protective layer 1 may be a colored coating layer containing a colorant such as dye or pigment dispersed in a resin.

Examples of the colorant may include azo dyes, acridine dyes, nitro dyes, triphenylmethane dyes, azomethine dyes, xanthene dyes, indigiod dyes, benzo- and naphthoquinone dyes, anthraquinone dyes, mordant dyes, pyrazolone dyes, stilbene dyes, quinoline dyes, thiazole dyes, hydrazone dyes, fluorescent dyes, cadmium yellow, molybdenum orange and cadmium red. These colorants may be used singly or in combination of two or more species as to block low-wavelength light of below 450 nm.

Examples of the binder resin used in the protective layer 1 may include polyacrylate resin, polysulfone resin, polyamide resin, acrylic resin, acrylonitrile resin, methacrylic resin, vinyl chloride resin, vinyl acetate resin, alkyd resin, polycarbonate, polyurethane, and nylon.

The protective layer 1 may have a thickness of 5-50 microns, preferably 8-20 microns, and the proportions of the colorant and the binder resin may be set to provide a transmittance with respect to visible light of 60% or above, preferably 80% or above, at the thickness of the protective layer 1. Further, it is preferred that the protective layer 1 shows a blocking or absorption rate of 80% or above, particularly 90% or above, with respect to short wavelength light of 450 nm or below. The protective layer 1 may be disposed to cover the entirety of the organic solar cell 6 or only the photo-illumination surface. It is also possible to cover only a part of the photoillumination surface where photo-degradation of the charge transporting substance lowers the photoelectric conversion efficiency.

In cases where the substrate 5 is transparent and photo-illumination is performed from the substrate 5 side, a protective layer may be disposed on the outer side of the substage 5 or between the substrate 5 and the electrode 4.

The protective layer may be formed by coating methods such as dip coating, spray coating, spinner coating, bead coating, wire-bar coating, blade coating, roller coating, curtain curtain, or other film forming methods such as inflation and extrusion.

Examples of the organic charge-transporting substance of layer 3 may include hydrazone compounds, such as N-methyl-N-phenylhydrazino-3-methylidene-9-ethylcarbazole, and p-diethylaminobenzaldehyde-N-α-naphthyl-N-phenylhydrazone; benzidine compounds, such as 4-diethylamino-4'-diphenlaminobiphenyl; and styryl compounds, such as α-phenyl-4-N,N'-diphenylaminostilbene, and 5-(4-dimethylaminobenzylidene)-5H-dibenzo[and] cycloheptane, which show absorption at wavelengths below 450 nm.

Further, examples of the charge generating substance of layer 3 may include azo pigments, phthalocyanine pigments, quinone pigments, and perylene pigments. The above-mentioned charge transporting substance and the charge generating substance may respectively be formed into paints together with an appropriate binding agent. The paints may be mixed to form a single layer or separately applied to form laminated layers of the organic photoconductive layer.

Hereinbelow the present invention will be more specifically described with reference to Examples.

EXAMPLE 1

Figure 2:
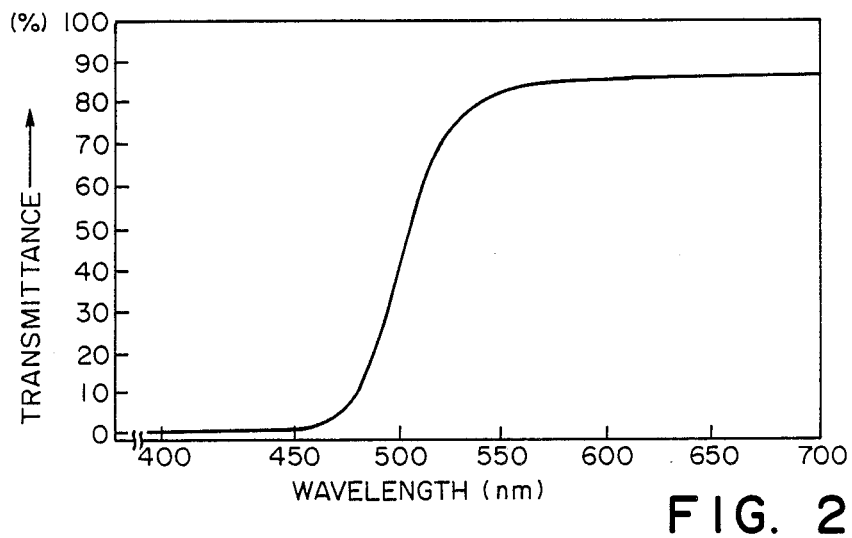
FIG. 2 is an optical transmittance-wavelength characteristic curve of a yellow film used as a protective layer in Example 1.
Figure 3:
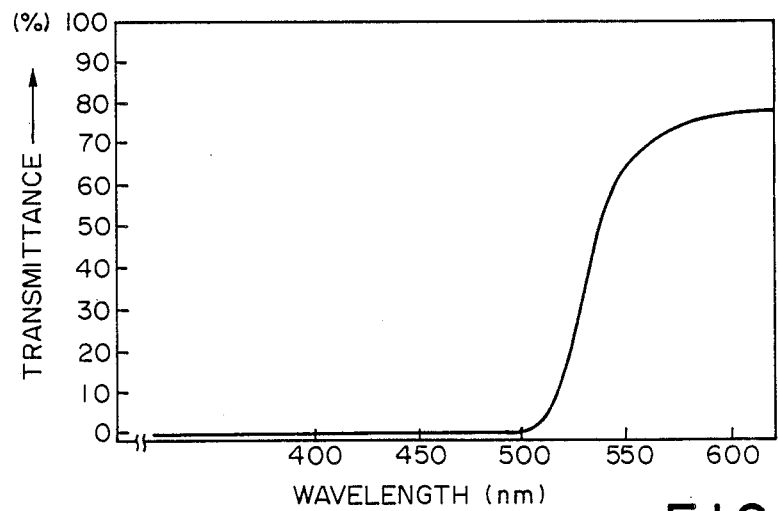
FIG. 3 is an optical transmittance-wavelength characteristic curve of a red film used as a protective layer in Comparative Example 4.

An organic solar cell 6 as shown if FIG. 1 was prepared. The cell comprised a transparent electrode 2 of $In_2O_3$ and a counter electrode 4 of Al between which a 2 micron-thick dispersion film 3 was intimately sandwiched. The dispersion film 3 comprised 5 parts by weight of a charge generating substance of copper-phthalocyanine (hereinbelow indicated as "Cu-Pc") and 5 parts by wt. of a charge transporting substance of the following structural formula (1):

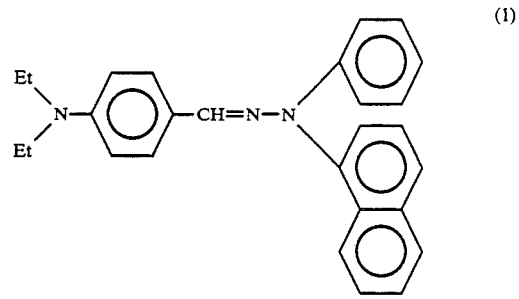

dispersed in 4 parts by wt. of butyral resin (trade name; S-LEC BM-2, available from Sekisui Kagaku K.K.) On the other hand, the protective layer 1 was an 80 micron-thick yellow film (available from K.K. Kimoto) showing absorption below 450 nm as seen in FIG. 2. The organic solar cell 6 was irradiated with white light of 100 W/cm² for 100 hours from the side of the protective layer 1 and the short-circuit photo-currents were measured at time immediately after the start of the irradiation ($I_0$) and 100 hours after the start of the irradiation ($I_1$), whereby the change in photocurrent was observed to be as small as 8 % and a good photovoltaic characteristic was obtained. The protective layer showed a transmittance of 87 % with respect to visible light, so that a good conversion efficiency was also obtained. The results are shown in Table 1 appearing hereinafter.

EXAMPLE 2

The same electrodes as in Example 1 were used. Between the electrodes was intimately disposed a 4 micron-thick dispersion film 3 comprising 5 parts by wt. of a charge generating substance of the following structural formula (2):

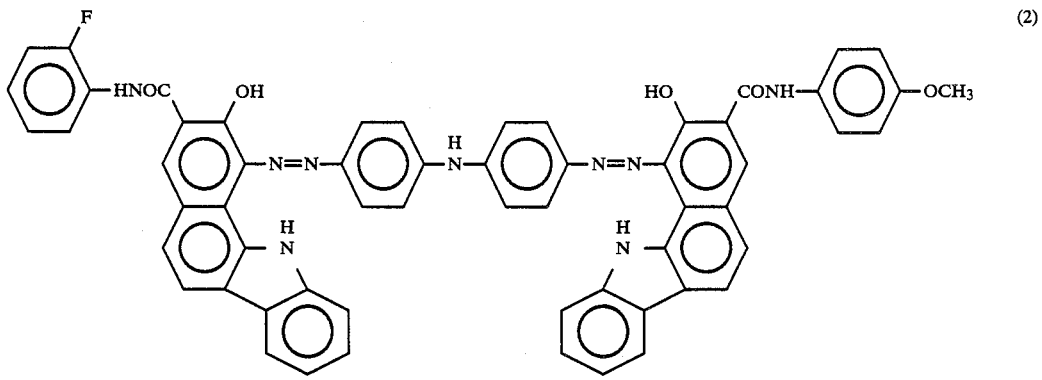

(2)

and 10 parts by wt. of a charge transporting substance of the following structural formula (3):

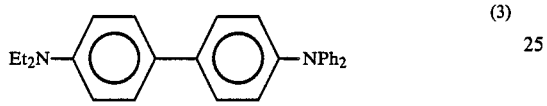

(3)

dispersed in 5 parts by weight butyral resin (S-LEC BM-2, Sekisui Kagaku K.K.).

The protective layer 1 was formed by dispersing 1 part by wt. of a dye of the following formula (4):

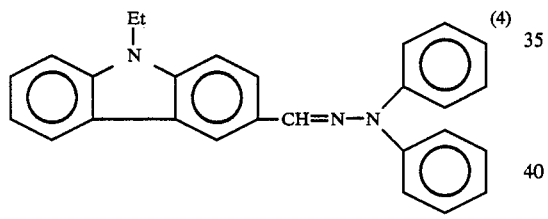

(4)

in 1 part by wt. of polycarbonate (trade name: Panlite L-1250) to form a 20 micron-thick coating film. The cell was evaluated in the same manner as in Example 1, whereby similarly good results of small variation in photo-current as in Example 1 were obtained, as shown in Table 1.

EXAMPLE 3

The same electrodes as in Example 1 were used. Between the electrodes was intimately disposed a 1.5 micron-thick dispersion film 3 comprising 5 parts by wt. of a charge generating substance of the following formula (5):

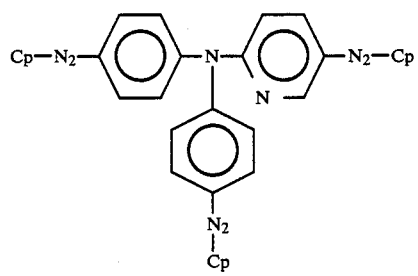

(5)

-continued

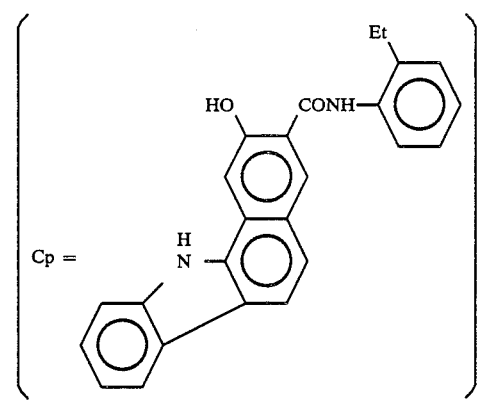

and 5 parts by wt. of a charge transporting substance of the following formula (6):

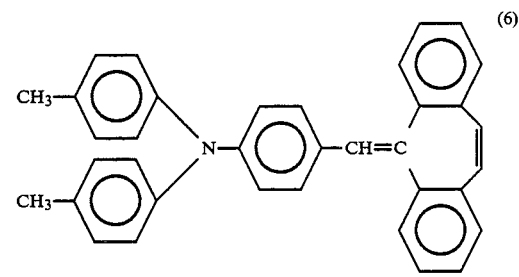

(6)

dispersed in 2 wt. parts of benzal resin (polymethyl methacrylate can be used alternatively).

The protective layer 1 was formed by dispersing 1 part by wt. of a dye of the following formula (7):

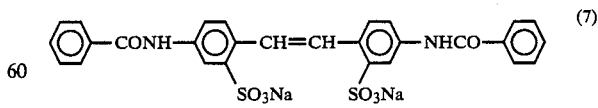

(7)

in 1 part by wt. of polycarbonate (trade Name: Panlite L-1250) to form a 20 micron-thick coating film. The cell was evaluated in the same manner as in Example 1, whereby similarly good results of small variation in photo-current as in Example 1 were obtained as shown in Table 1.

EXAMPLE 4

The same electrodes as in Example 1 were used. On the Al counter electrode 4, a 2.5 micron-thick dispersion film comprising 5 parts by wt. of Cu-Pc dispersed in 2 parts by wt. of butyral resin was formed as a charge generating layer, and thereon a 0.5 micron dispersion film comprising 5 parts by wt. of the charge transporting substance of the above-described structural formula (1) Dispersed in 5 parts by wt. of butyral resin was coated and further coated with the $In_2O_3$ electrode 2.

The protective layer 1 was formed by dispersing 1 part by wt. of a dye of the following formula (8):

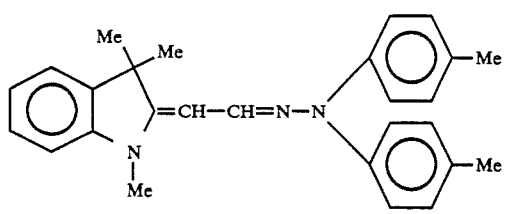

(8)

in 1 part by wt. of polycarbonate to form a 20 micron-thick coating film. The cell was evaluated in the same manner as in Example 1, whereby similarly good results of small variation in photo-current as in Example 1 were obtained as shown in Table 1.

COMPARATIVE EXAMPLE 1

A cell was prepared in the same manner as in Example 1 except that the protective layer was omitted. The cell was evaluated in the same manner as in Example 1, whereby a large change of 45% in photocurrent was observed due to photo-degradation of the charge-transporting substance. The results are also shown in Table 1.

COMPARATIVE EXAMPLE 2

A cell was prepared in the same manner as in Example 2 except that the protective layer was omitted. The cell was evaluated in the same manner and the results are also shown in Table 1.

COMPARATIVE EXAMPLE 3

A cell was prepared using the same electrodes as in Example 1. Between the electrodes was intimately disposed a 4 micron-thick dispersion film 3 comprising 5 parts by wt. of a charge generating substance of the above-described formula (2) and 10 parts by wt. of a charge transporting substance of the following structural formula (9):

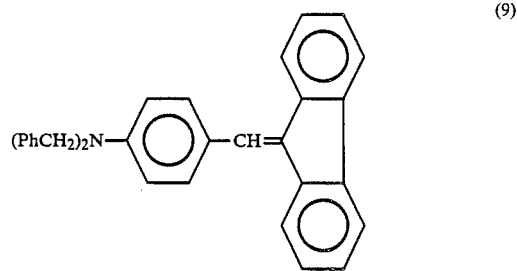

(9)

dispersed in 5 parts by wt. of butyral resin (trade name: S-LEC BM-2).

The protective layer 1 was formed by dispersing 1 part by wt. of the dye of the above-described formula (4) in 1 part by wt. of polycarbonate (Panlite L-1 250) to form a 20 micron-thick coating film.

As a result of evaluation in the same manner as in Example 1, a large change in photo-current was observed due to photo-degradation of the charge transporting substance, which may be attributable to the fact that the charge transporting substance had a larger absorption edge than that of the protective layer so that a part of the low wavelength light having passed through the protective layer was absorbed by the charge transporting substance. The results are also shown in Table 1.

COMPARATIVE EXAMPLE 4

A cell was prepared in the same manner as in Example 4 except that the protective layer was replaced by an 80 micron-thick red film (available from K.K. Kimoto) absorbing 500 nm and below, and evaluated in the same manner. Little change in photo-current was observed. However, as the absorption edge of the protective layer was shifted by about 50 nm to a longer wavelength side, the amount of visible light transmitted therethrough was decreased to hinder the generation of photocarriers and lower the conversion efficiency. The results are also shown in Table 1.

TABLE 1

| | | Protective layer | | Absorption edge of charge-transporting layer (nm) | $I_0$ ($\mu A/cm^2$) | Change in photo-current $I_1/I_0 \times 100$ (%) |
|---|---|---|---|---|---|---|
| | | Transmittance (%) | Absorption edge (nm) | | | |
| Example | 1 | 87 | 450 | 420 | 0.85 | 92 |
| | 2 | 80 | 460 | 400 | 0.44 | 90 |
| | 3 | 76 | 440 | 410 | 0.63 | 85 |
| | 4 | 78 | 450 | 420 | 0.80 | 88 |
| Comparative Example | 1 | — | — | 420 | 0.77 | 55 |
| | 2 | — | — | 400 | 0.38 | 47 |
| | 3 | 80 | 460 | 520 | 0.45 | 45 |
| | 4 | 75 | 500 | 420 | 0.47 | 85 |

$I_0$: Short circuit photo-current at the initial stage of illumination
$I_1$: Short circuit photo-current after 100 hours of illumination

What is claimed is:

1. An organic solar cell, comprising an organic photoconductive layer comprising a charge generating substance and a charge transporting substance, and a protective layer covering the organic photoconductive layer and blocking low-wavelength light of below 450 nm.

2. A cell according to claim 1, wherein the organic photoconductive layer comprises a layer comprising a mixture of the charge generating substance and the charge transporting substance.

3. A cell according to claim 1, wherein the organic photoconductive layer comprises a laminated structure including a layer comprising the charge generating substance and a layer comprising the charge transporting substance.

4. A cell according to claim 1, wherein the protective layer has a transmittance of at least 60% with respect to visible light.

5. A cell according to claim 1 or 4, wherein the following relationship is satisfied:

$$\lambda 0 \leqq \lambda 1 \leqq \lambda 0 + 50,$$

wherein $\lambda 1$ denotes the photo-absorption edge in nm of the protective layer, and $\lambda 0$ denotes the photoabsorption edge in nm of the charge transporting substance in the organic photoconductive layer.

* * * * *

UNITED STATES PATENT AND TRADEMARK OFFICE
CERTIFICATE OF CORRECTION

PATENT NO. : 4,963,196

DATED : October 16, 1990

INVENTOR(S) : YUICHI HASHIMOTO

It is certified that error appears in the above-identified patent and that said Letters Patent is hereby corrected as shown below:

COLUMN 3

Line 41, "substage 5" should read --substrate 5--.
    Line 47, "curtain curtain," should read
          --curtain coating,--.

COLUMN 4

Line 40, "K.K.) On" should read --K.K.). ¶ On--.

Signed and Sealed this

Thirteenth Day of October, 1992

Attest:

DOUGLAS B. COMER

Attesting Officer     Acting Commissioner of Patents and Trademarks